(12) United States Patent
Hsieh et al.

(10) Patent No.: US 7,295,073 B2
(45) Date of Patent: Nov. 13, 2007

(54) AUTOMATIC GAIN CONTROL APPARATUS

(75) Inventors: Bing-Yu Hsieh, Taipei (TW);
Meng-Hsueh Lin, Banciao (TW);
Wei-Hsuan Tu, Hsinchu (TW)

(73) Assignee: MediaTek Inc. (TW)

( * ) Notice: Subject to any disclaimer, the term of this patent is extended or adjusted under 35 U.S.C. 154(b) by 119 days.

(21) Appl. No.: 11/334,405

(22) Filed: Jan. 19, 2006

(65) Prior Publication Data

US 2007/0164823 A1    Jul. 19, 2007

(51) Int. Cl.
*H03G 3/30* (2006.01)
(52) U.S. Cl. .................... 330/279; 330/129
(58) Field of Classification Search ............ 330/129, 330/278, 279, 282; 341/139, 155; 455/232.1, 455/234.1, 245.1
See application file for complete search history.

(56) References Cited

U.S. PATENT DOCUMENTS

| | | | |
|---|---|---|---|
| 4,963,969 A | 10/1990 | Kitaura et al. | |
| 5,117,201 A | 5/1992 | Luther | |
| 5,206,647 A | 4/1993 | Stone | |
| 5,343,200 A | 8/1994 | Matsui | |
| 5,389,927 A | 2/1995 | Turney et al. | |
| 5,422,601 A | 6/1995 | Kovacs et al. | |
| 5,448,424 A | 9/1995 | Hirano et al. | |
| 5,469,115 A | 11/1995 | Peterzell et al. | |
| 5,559,770 A | 9/1996 | Hiroki et al. | |
| 5,796,358 A | 8/1998 | Shih et al. | |
| 5,917,372 A | 6/1999 | Kakura et al. | |
| 5,917,794 A | 6/1999 | Honma | |
| 5,917,865 A * | 6/1999 | Kopmeiners et al. | .... 455/245.1 |
| 5,946,607 A | 8/1999 | Shiino et al. | |
| 6,018,554 A | 1/2000 | Glover | |
| 6,038,435 A | 3/2000 | Zhang | |
| 6,169,638 B1 | 1/2001 | Morling | |
| 6,259,391 B1 | 7/2001 | Pakravan et al. | |
| 6,289,044 B1 | 9/2001 | Velez et al. | |
| 6,292,120 B1 | 9/2001 | Painchaud et al. | |
| 6,297,698 B1 | 10/2001 | Callahan, Jr. | |
| 6,369,739 B1 | 4/2002 | Inada et al. | |
| 6,404,829 B1 | 6/2002 | Sonu | |
| 6,459,458 B1 | 10/2002 | Balaban | |
| 6,516,185 B1 | 2/2003 | MacNally | |
| 6,606,047 B1 | 8/2003 | Borjesson et al. | |
| 6,668,027 B1 | 12/2003 | Scarpa | |
| 6,680,680 B1 | 1/2004 | Mellot | |
| 6,725,169 B2 | 4/2004 | Thielman et al. | |
| 6,759,902 B2 | 7/2004 | Kossor | |
| 6,816,013 B2 | 11/2004 | Kao | |
| 6,836,229 B2 | 12/2004 | Gregoire | |
| 6,842,410 B1 | 1/2005 | Spielman et al. | |
| 6,930,553 B2 * | 8/2005 | Takahashi | .................. 330/279 |

* cited by examiner

*Primary Examiner*—Khanh Van Nguyen
(74) *Attorney, Agent, or Firm*—Rothwell Figg Ernst & Manbeck, P.C.

(57) ABSTRACT

An automatic gain control apparatus receiving an analog signal and outputting a digital signal includes a variable gain amplifier, an A/D converter, and a feedback circuit. The variable gain amplifier amplifies the analog signal with a gain. The A/D converter converts the amplified analog signal to the digital signal. The feedback circuit includes an amplitude level detector, a range detector, and a gain controller. The amplitude level detector generates a first amplitude level and a second amplitude level in response to the digital signal. The range detector generates an adjustment signal in response to the first amplitude level and the second amplitude level. The gain controller adjusts a gain control level for the variable gain amplifier in response to the adjustment signal.

15 Claims, 9 Drawing Sheets

AUTOMATIC GAIN CONTROL APPARATUS

BACKGROUND OF THE INVENTION

1. Field of the Invention

The present invention relates to an automatic gain control apparatus; more particularly, relates to an automatic gain control apparatus, which fully utilizes the input range of an A/D converter thereof.

2. Descriptions of the Related Art

An analog to digital (A/D) converter is frequently used in many kinds of electronic circuits. The function of an A/D converter is to receive an analog signal and to generate a digital signal in response to the analog signal.

In some kinds of electronic circuits, it is desirable to maintain a peak value of the analog signal smaller than a maximum value accepted by the A/D converter to avoid distortion. In some further kinds of electronic circuits, the peak value is deliberately arranged close to, but still smaller than, the maximum value so that the full input range of the A/D converter may be used. The A/D converter in an automatic gain control circuit is expected to meet the aforementioned requirements.

One example of the conventional automatic gain control circuit is disclosed in the U.S. Pat. No. 6,292,120. The automatic gain control circuit of the U.S. patent is illustrated in FIG. 1 of the present drawings. The automatic gain control circuit 1 includes an A/D converter 11, a fixed gain amplifier 12, a D/A converter 13, a microcontroller 15, and a variable gain amplifier 19. The microcontroller 15 is configured to generate a feedback signal 14 for the D/A converter 13 in response to a digital signal 16. The D/A converter 13 is configured to adjust a gain of the variable amplifier 19 so that an input range of the A/D converter 11 may be fully used.

One disadvantage of the automatic gain control circuit 1 is that this apparatus 1 cannot adjust a DC offset of an analog signal 10. If the DC offset is remained, the DC offset will influence the full utilization of input range of the A/D converter 11 because the DC offset shifts the center of the amplified analog signal from the center of the input range of the A/D converter 11. This makes that, for example, the top peak of the amplified analog signal reaches the upper boundary of the input range of the A/D converter 11, but the bottom peak of the amplified analog signal is not even close to the lower boundary of the input range if the DC offset is a positive voltage.

Another example of the conventional automatic gain control apparatus is disclosed in the U.S. Pat. No. 5,946,607. The automatic gain control circuit shown in FIG. 3 of the U.S. patent is illustrated in FIG. 2 of the present drawings. The automatic gain control circuit 2 comprises a gain controllable amplifier 21, an A/D converter 23, a DC offset detector 25, and an adder 27. The automatic gain control apparatus 2 generates a gain control signal 22 to control a gain of the gain controllable amplifier 21. A DC offset is detected at an output end of the A/D converter 23 by the DC offset detector 25. Then the DC offset is removed by the adder 27.

One disadvantage of the automatic gain control apparatus 2 is that though it removes the DC offset by the DC offset detector 25, the DC offset detector 25 operates after the A/D converter 23. This means that the DC offset still exists at an input end of the A/D converter 23. Hence, the DC offset still influences the idea of using the full input range of the A/D converter 23. Though the DC offset still can be removed by placing a high pass filter in front of the A/D converter, a required off-chip capacitor to achieve a low cut-off frequency value is costly.

Due to the drawbacks, an automatic gain control apparatus, which may fully utilize an input range of an A/D converter of an automatic gain control apparatus, is still needed in the industrial field. An automatic gain control apparatus, which may remove a DC offset in a more cost-effective way in front of the A/D converter, is more eagerly required.

SUMMARY OF THE INVENTION

One object of this invention is to provide an automatic gain control apparatus comprising a variable gain amplifier, an A/D converter, and a feedback circuit. The variable gain amplifier is configured to amplify an analog signal with a gain. The A/D converter is configured to convert the amplified analog signal to a digital signal. The feedback circuit comprises an amplitude level detector, a range detector, and a gain controller. The amplitude level detector is configured to generate a first amplitude level and a second amplitude level in response to the digital signal. The range detector is configured to generate an adjustment signal in response to the first amplitude level and the second amplitude level. The gain controller is configured to adjust a gain control level in response to the adjustment signal. The gain is updated according to the gain control level.

The amplitude level detector may comprise a DC level detector for detecting a DC level of the digital signal. The automatic gain control apparatus further comprises a filter, connected between the variable gain amplifier and the A/D converter, for removing a DC offset of the amplified analog signal in response to the DC level. The DC level compensates for the DC offset without an expensive external capacitor.

The present invention has the advantage of fully utilizing an input range of an A/D converter of the automatic gain control apparatus, especially has the advantage of fully utilizing an input range of the A/D converter by removing a DC offset and detecting if both the first amplitude level and the second amplitude level fall within a predetermined range.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
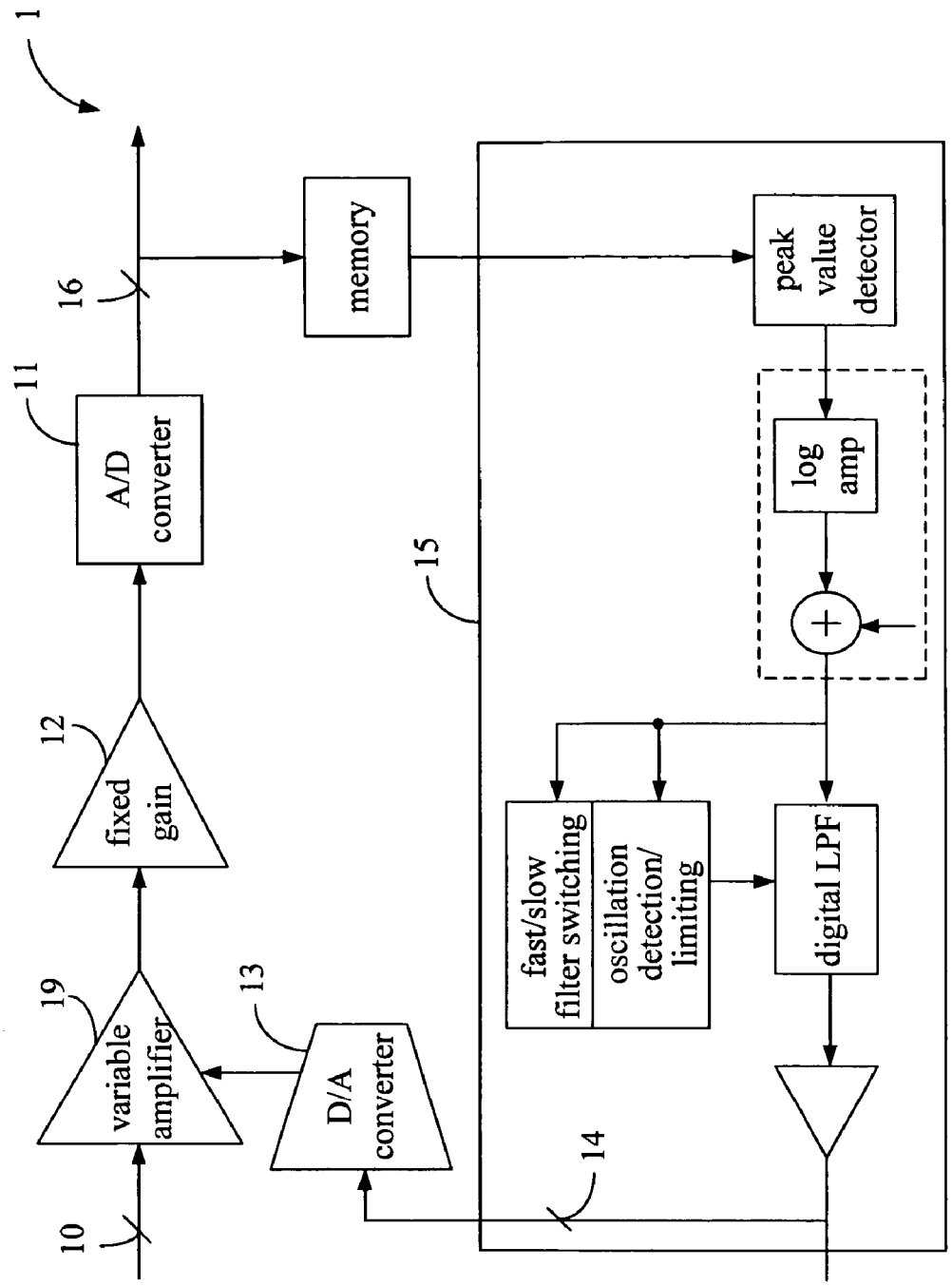
FIG. 1 is a block diagram illustrating a conventional automatic gain control circuit.
Figure 2:
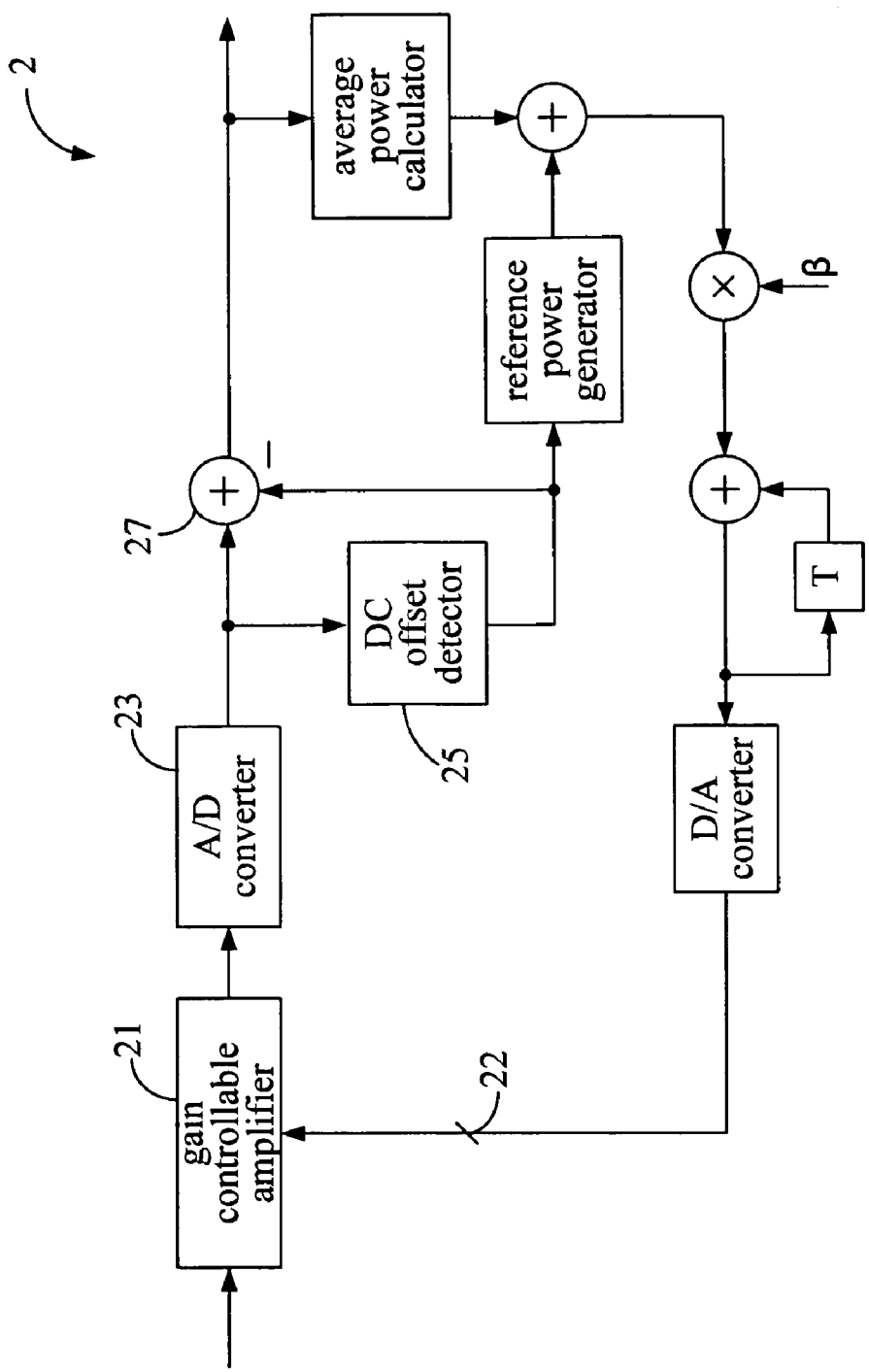
FIG. 2 is a block diagram illustrating another conventional automatic gain control apparatus.
Figure 3:
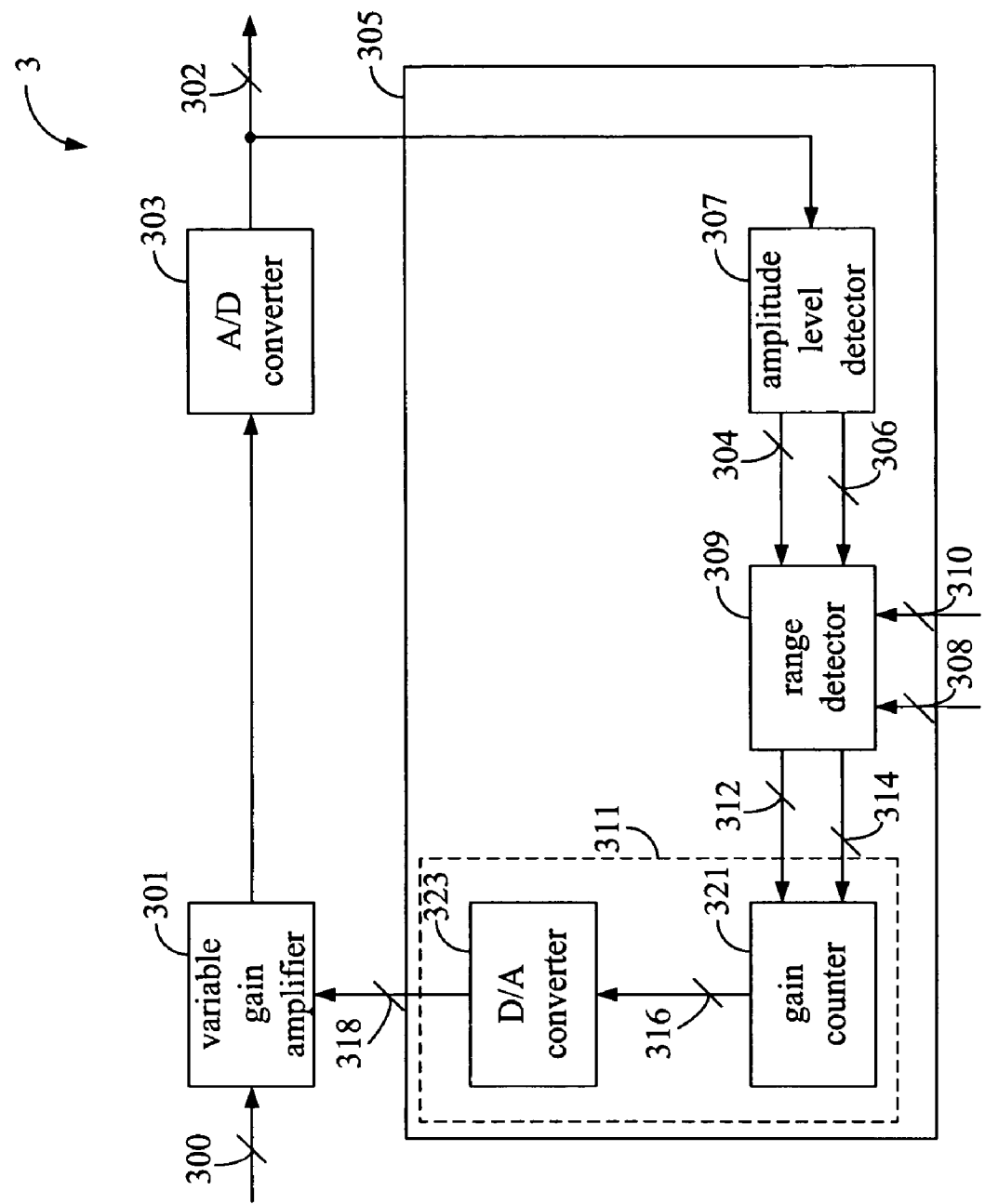
FIG. 3 is a block diagram illustrating a first embodiment of the present invention.

A first embodiment of the present invention is an automatic gain control apparatus as illustrated in FIG. 3. The automatic gain control apparatus 3 comprises a variable gain amplifier 301, an A/D converter 303, and a feedback circuit 305. The variable gain amplifier 301 is configured to amplify an analog signal 300 with a gain. The A/D converter 303 is configured to convert the analog signal 300 after being amplified to a digital signal 302. The feedback circuit 305 is configured to adjust the gain in response to the digital signal 302. In other words, the feedback circuit 305 is a gain adjustment device.

The feedback circuit 305 comprises an amplitude level detector 307, a range detector 309, and a gain controller 311. The amplitude level detector 307 is configured to generate a first amplitude level 304 and a second amplitude level 306 in response to the digital signal 302. More particularly, the first amplitude level 304 responds to a top peak of the analog signal 300 and the second amplitude level 306 responds to a bottom peak of the analog signal 300. The information of the top and bottom peaks of the analog signal 300 is carried by the digital signal 302. The range detector 309 is configured to generate an adjustment signal, which comprises an up signal 312 and a down signal 314, in response to the first amplitude level 304 and the second amplitude level 306. Rather than the up signal 312 and the down signal 314, the adjustment signal can be one of a signed digital step signal and a differential analog voltage signal. The signed digital step signal comprises a positive digital step signal and a negative digital step signal.

The gain controller 311 adjusts a gain control level for the variable gain amplifier 301 in response to the adjustment signal. In this embodiment, the adjustment signal refers to the up signal 312 and the down signal 314. The up signal 312 is generated if the gain is determined too small. The down signal 314 is generated if the gain is determined too large. If the adjustment signal is the signed digital step signal, the positive digital step signal is generated if the gain is determined too small, and the negative digital step signal is generated if the gain is determined too large. The analog signal 300 is, hence, adjusted to fit the input range of the A/D converter 303.

Figure 4:
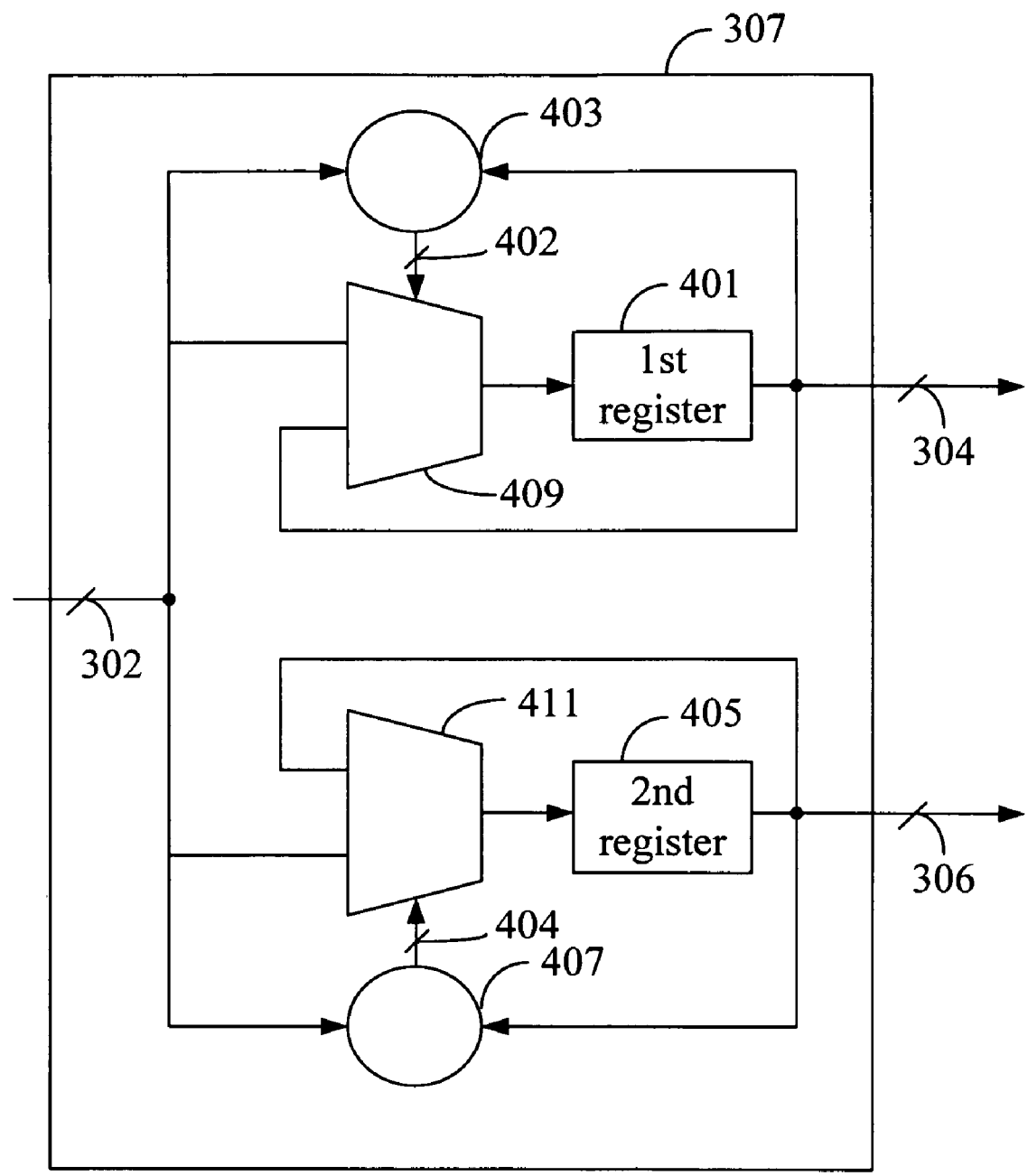
FIG. 4 is a block diagram illustrating an amplitude level detector of the first embodiment.

FIG. 4 illustrates the block diagram of the amplitude level detector 307 of the automatic gain control apparatus 3. The amplitude level detector 307 comprises a first register 401, a first comparator 403, a second register 405, and a second comparator 407. The first register 401 is configured to store the first amplitude level 304, and the second register 405 is configured to store the second amplitude level 306. The first comparator 403 is configured to compare the digital signal 302 with the first amplitude level 304 after being stored. The second comparator 407 is configured to compare the digital signal 302 with the second amplitude level 306 after being stored. The first amplitude level 304 and the second amplitude level 306 after being stored refer to the digital signal 302 stored in the first register 401 and the second register 405, respectively. The first amplitude level 304 is updated if the digital signal 302 is larger than the first amplitude level 304. The second amplitude level 306 is updated if the digital signal 302 is smaller than the second amplitude level 306. The first amplitude level 304 and the second amplitude level 306 after being updated are then stored in the first register 401 and the second register 405, respectively. If the digital signal 302 is not larger than the first amplitude level 304, the first amplitude level 304 is invariable. Similarly, if the digital signal 302 is not smaller than the second amplitude level 306, the second amplitude level 306 is invariable.

More specifically, the amplitude level detector 307 further comprises a first multiplexer 409 and a second multiplexer 411. As FIG. 4 shows, if the first comparator 403 determines that the digital signal 302 is larger than the first amplitude level 304, a first output signal 402 of the first comparator 403 makes the first multiplexer 409 to allow the digital signal 302 pass through and then the first amplitude level 304 in the first register 401 is thereby updated by the digital signal 302. Similarly, if the second comparator 407 determines that the digital signal 302 is smaller than the second amplitude level 306, a second output signal 404 of the second comparator 407 makes the second multiplexer 411 to allow the digital signal 302 pass through and then the second amplitude level 306 in the second register 405 is thereby updated by the digital signal 302.

Figure 5:
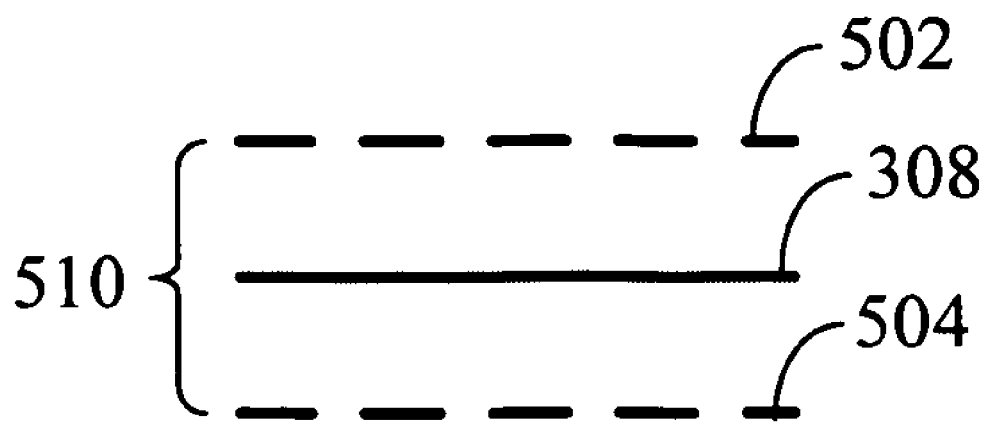
FIG. 5 is a block diagram illustrating a convergence range of the first embodiment.
Figure 5:
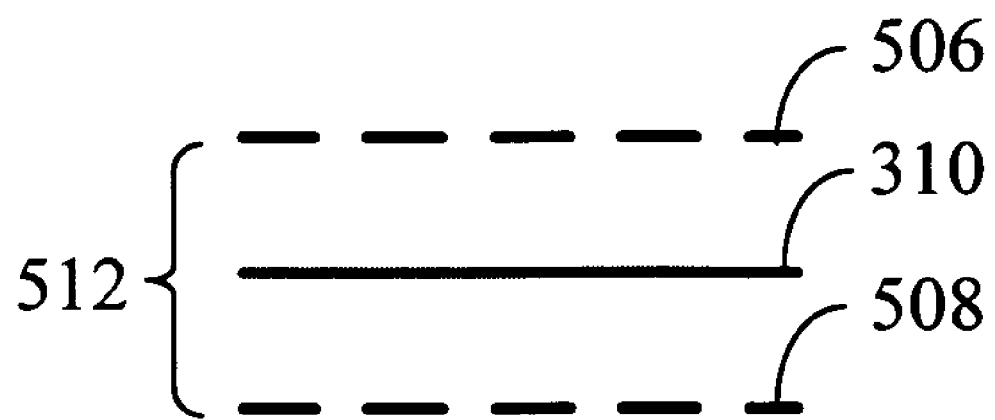

Referring back to FIG. 3, the range detector 309 also receives a top threshold 308 and a bottom threshold 310 both of which are pre-determined. The top threshold 308 and the bottom threshold 310 carry information of an upper boundary and a lower boundary of the input range of the AND converter 303, respectively. As FIG. 5 shows, the range detector 309 defines a top convergence range 510 and a bottom convergence range 512 based on the top threshold 308 and the bottom threshold 310, respectively. An upper boundary of the top convergence range 510 is a maximum top threshold 502 which is (the top threshold 308+an offset). A lower boundary of the top convergence range 510 is a minimum top threshold 504 which is (the top threshold 308−the offset). An upper boundary of the bottom convergence range 512 is a maximum bottom threshold 506 which is (the bottom threshold 310+the offset). A lower boundary of the bottom convergence range 512 is a minimum bottom threshold 508 which is (the bottom threshold 310−the offset). The offset is predetermined to be zero or any positive value. Theoretically, if at least one of the first amplitude level 304 and the second amplitude level 306 falls within the corresponding convergence range, the input range of the A/D converter 303 is regarded fully used.

More particularly, the range detector 309 determines whether one of the first amplitude level 304 and the second amplitude level 306 falls within the corresponding convergence range and the other falls between the maximum top threshold 502 and the minimum bottom threshold 508. If yes, this means the input range of the A/D converter 303 is fully used so that the range detector 309 suppresses the generation of the adjustment signal. If no, this means the input range of the A/D converter 303 is not fully used so that the range detector 309 generates the adjustment signal.

Figure 6:
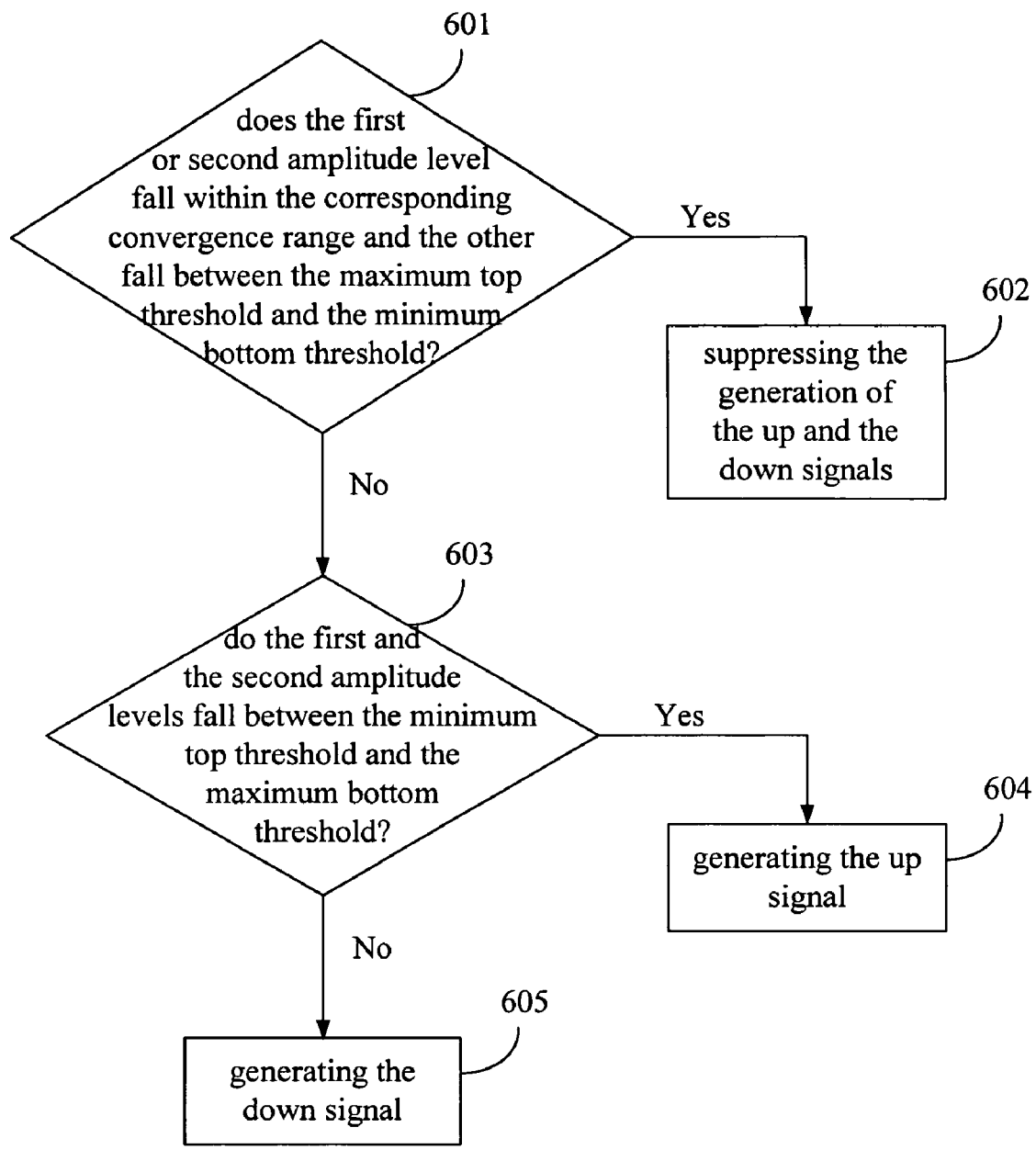
FIG. 6 is a flow chart showing steps for generating an up signal and a down signal.

There is another process, shown in FIG. 6, for generating the up signal 312 and the down signal 314. In step 601, the range detector 309 determines whether the first amplitude level 304 or the second amplitude level 306 falls within the corresponding convergence range and the other falls between the maximum top threshold 502 and the minimum bottom threshold 508. If yes, this means the input range of the A/D converter 303 is fully used. Step 602 is then executed in which the range detector 309 suppresses the generation of the up signal 312 and the down signal 314. If not, step 603 is executed in which the range detector 309 further determines whether both of the first amplitude level 304 and the second amplitude level 306 fall between the minimum top threshold 504 and the maximum bottom threshold 506. If yes, this means the analog signal 300 is too small to fully use the input range of the A/D converter 303. Step 604 is then executed in which the range detector 309 generates the up signal 312. If not, this means the analog signal 300 is too large to fit the full input range of the A/D converter 303. Step 605 is then executed in which the range detector 309 generates the down signal 314. In other words, the up signal 312 is generated if the gain is determined too small, and the down signal 314 is generated if the gain is determined too large.

In this embodiment, both of the up signal 312 and the down signal 314 are a plurality of pulses. The adjustment of the up signal 312 or the down signal 314 refers to adding or eliminating the number of pulses. Therefore, the numbers of the pulses of the up signal 312 and the down signal 314 respond to the first amplitude level 304 and the second amplitude level 306. Those skilled in the art also may also realize that both of the up signal 312 and the down signal 314 can be digital signals which use 0 or 1 to indicate the adjustment. Furthermore, both of the up signal 312 and the down signal 314 may also be analog signals whose voltages indicate the adjustment.

Referring back to FIG. 3, the gain controller 311 comprises a gain counter 321 and a D/A converter 323. The gain counter 321 is configured to count a gain control level 316 in response to the numbers of the pulses of the up signal 312 and the down signal 314. The D/A converter 323 is configured to receive the gain control level 316 and to convert the gain control level 316 to an analog adjustment signal 318. The gain of the variable gain amplifier 301 is adjusted according to the analog adjustment signal 318.

Instead of the aforementioned gain counter 321 and D/A converter 323, the gain controller 311 may be implemented under an analog procedure. For example, the gain controller 311 may comprise a charge pump circuit and a capacitor. The charge pump circuit is configured to charge or discharge in response to the adjustment signal, such as the up signal 312, the down signal 314, the signed digital step signal, and the differential analog voltage signal, etc. The capacitor is configured to hold a voltage level after the charge or discharge. The gain of the variable gain amplifier 301 is adjusted according to the voltage level.

Accordingly, the first embodiment fully utilizes the input range of the A/D converter 303 by considering the first amplitude level 304 and the second amplitude level 306 which carry the information the top peak and the bottom peak of the analog signal 300, respectively.

Figure 7:
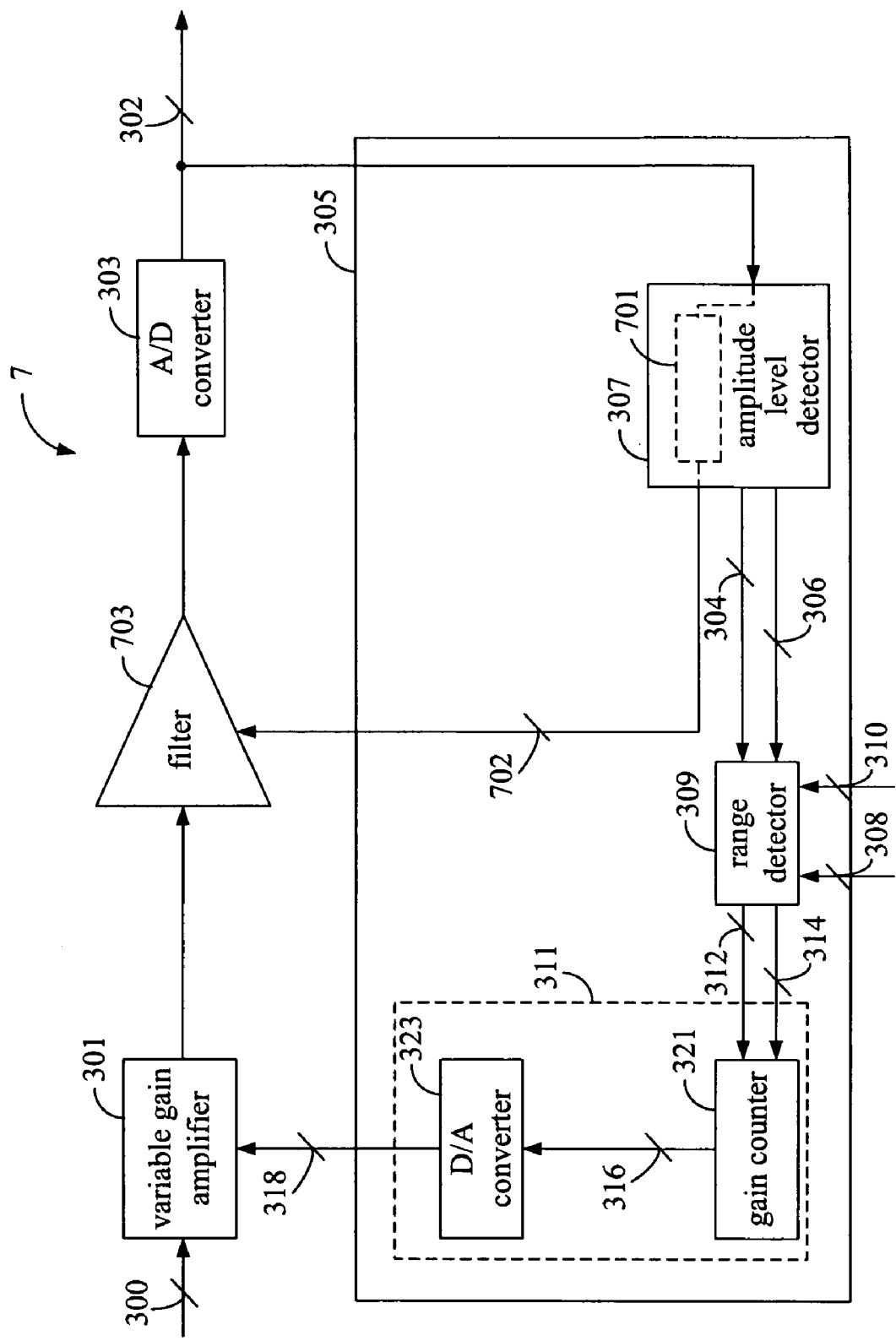
FIG. 7 is a block diagram illustrating a second embodiment of the present invention.

A second embodiment of the present invention is an automatic gain control apparatus 7 as illustrated in FIG. 7. In contrast with the first embodiment, the amplitude level detector 307 further comprises a DC level detector 701. The DC level detector 701 is configured to detect a DC level of the digital signal 302 and to output a DC level signal 702 carrying information of the DC level of the digital signal 302.

In contrast with the first embodiment, the automatic gain control apparatus 7 further comprises a filter 703 which is connected between the variable gain amplifier 301 and the A/D converter 303. The filer 703 is configured to receive the DC level signal 702 and to remove a DC offset of the analog signal 300 after the analog signal 300 is amplified by the variable gain amplifier 301 in response to the DC level. Although some automatic gain control apparatuses of the prior art set a high-pass filter between the variable gain amplifier and the A/D converter to remove the DC offset, the DC offset removal efficiency of the filter 703 in the second embodiment is better than that of the high-pass filter of the prior art because the filter 703 operates in response to the feedback signal, the DC level signal 702, and the high-pass filter of the prior art operates in an open loop.

Figure 8:
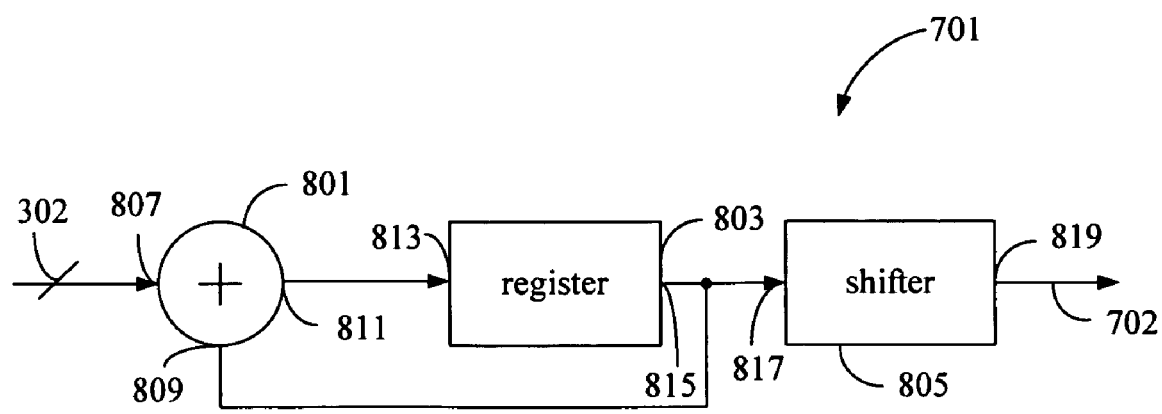
FIG. 8 is a block diagram illustrating a DC level detector of the second embodiment.

FIG. 8 shows the block diagram of the DC level detector 701. The DC level detector 701 comprises an adder 801, a register 803, and a shifter 805. The adder 801 comprises a first input end 807, a second input end 809 and an output end 811. The register 803 comprises an input end 813 and an output end 815. The shifter 805 comprises an input end 817 and an output end 819. The first input end 807 receives the digital signal 302. The second input end 809 is connected to the output end 815. The output end 811 is connected to the input end 813. The output end 815 is connected to the input end 817. The output end 819 outputs the DC level signal 702.

Accordingly, the second embodiment fully utilizes the input range of the A/D converter 303 not only by considering the first amplitude level 304 and the second amplitude level 306, but also by removing the DC offset.

Figure 9:
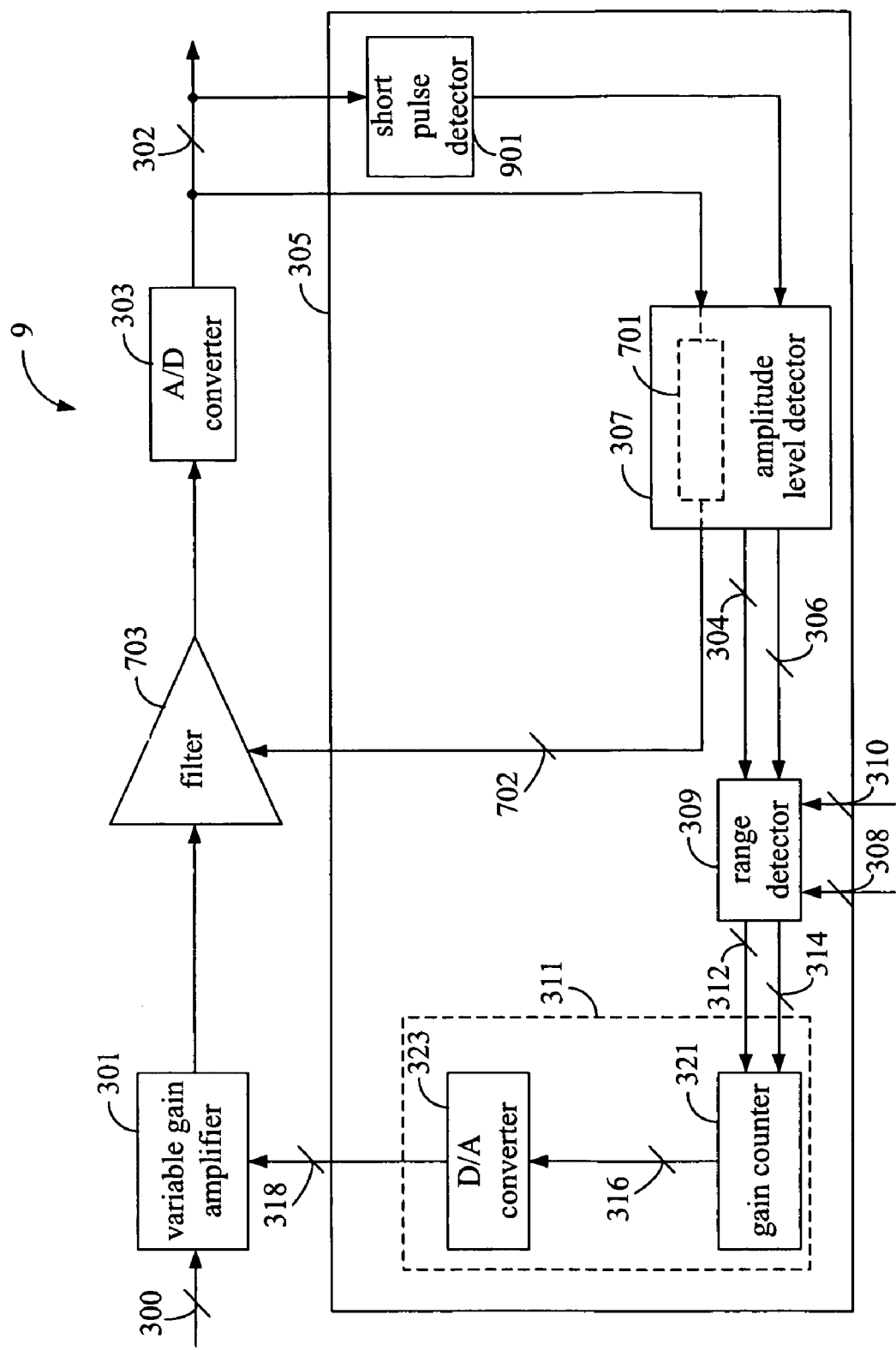
FIG. 9 is a block diagram illustrating a third embodiment of the present invention.

A third embodiment of the present invention is an automatic gain control apparatus 9 as illustrated in FIG. 9. In contrast with the second embodiment, the feedback circuit 305 further comprises a short pulse detector 901. The short pulse detector 901 is configured to determine whether the digital signal 302 is a short pulse signal, i.e., a short T signal. If yes, the short pulse detector 901 bypasses the digital signal 302. If not, the short pulse detector 901 stops the transmission of the digital signal 302. The short pulse digital signal 302 is transmitted to the amplitude level detector 307, and the amplitude level detector 307 generates the first amplitude level 304 and the second amplitude level 306 in response to the short pulse digital signal 302, i.e., the digital signal 302 after being bypassed.

Generally speaking, the peak of a short pulse signal is smaller than the peak of a long pulse signal. If the first amplitude level 304 and the second amplitude level 306 are determined based on a short pulse signal, the gain of the variable gain amplifier 301 is adjusted based on a short pulse signal. This means that the analog signal 300, when it is a short pulse signal, may be amplified to fit the input range of the A/D converter 303. Therefore, the digital signal 302 corresponding to the short pulse analog signal 300 would be boosted and processed correctly.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. An automatic gain control apparatus, comprising:
   a variable gain amplifier for amplifying an analog signal with a gain;
   an A/D converter for converting the amplified analog signal to a digital signal; and
   a feedback circuit, comprising:
      an amplitude level detector for generating a first amplitude level and a second amplitude level in response to the digital signal;
      a range detector for generating an adjustment signal in response to the first amplitude level and the second amplitude level; and
      a gain controller for adjusting a gain control level in response to the adjustment signal;

wherein the gain is updated according to the gain control level.

2. The automatic gain control apparatus of claim 1, wherein the amplitude level detector comprises:
a first register for storing the first amplitude level;
a first comparator for comparing the digital signal with the first amplitude level;
a second register for storing the second amplitude level; and
a second comparator for comparing the digital signal with the second amplitude level.

3. The automatic gain control apparatus of claim 2, wherein the first amplitude level is updated if the digital signal is larger than the first amplitude level, and the second amplitude level is updated if the digital signal is smaller than the second amplitude level.

4. The automatic gain control apparatus of claim 1, wherein the adjustment signal is one of a signed digital step signal and a differential analog voltage signal.

5. The automatic gain control apparatus of claim 1, wherein the range detector determines whether one of the first amplitude level and the second amplitude level falls within a corresponding convergence range and the other falls between a maximum top threshold and a minimum bottom threshold, if yes, the range detector suppresses the generation of the adjustment signal, and if no, the range detector generates the adjustment signal.

6. The automatic gain control apparatus of claim 1, wherein the adjustment signal comprises an up signal and a down signal, the up signal is generated if the gain is determined too small, and the down signal is generated if the gain is determined too large.

7. The automatic gain control apparatus of claim 6, wherein the range detector determines whether one of the first amplitude level and the second amplitude level falls within a corresponding convergence range and the other falls between a maximum top threshold and a minimum bottom threshold, if not, the range detector determines whether both of the first amplitude level and the second amplitude level fall between a minimum top threshold and a maximum bottom threshold, if yes, the range detector generates the up signal, and if no, the range detector generates the down signal.

8. The automatic gain control apparatus of claim 7, wherein the corresponding convergence range is a top convergence range, the range detector receives a top threshold for defining the top convergence range, the maximum top threshold of the top convergence range is (the top threshold+an offset), the minimum top threshold of the top convergence range is (the top threshold−the offset), and the offset is predetermined.

9. The automatic gain control apparatus of claim 7, wherein the corresponding convergence range is a bottom convergence range, the range detector receives a bottom threshold for defining the bottom convergence range, the maximum bottom threshold of the bottom convergence range is (the bottom threshold+an offset), the minimum bottom threshold of the bottom convergence range is (the bottom threshold−the offset), and the offset is predetermined.

10. The automatic gain control apparatus of claim 1, wherein the gain controller comprises:
a charge pump circuit for charging or discharging in response to the adjustment signal; and
a capacitor for holding a voltage level after the charge or discharge;
wherein the gain is adjusted according to the voltage level.

11. The automatic gain control apparatus of claim 1, wherein the gain controller comprises:
a gain counter for counting the gain control level according to the adjustment signal; and
a D/A converter for converting the gain control level to an analog adjustment signal;
wherein the gain is adjusted according to the analog adjustment signal.

12. The automatic gain control apparatus of claim 1, wherein the amplitude level detector comprises a DC level detector for detecting a DC level of the digital signal.

13. The automatic gain control apparatus of claim 12, further comprising a filter, connected between the variable gain amplifier and the A/D converter, for removing a DC offset of the amplified analog signal in response to the DC level.

14. The automatic gain control apparatus of claim 12, wherein the DC level detector comprises:
an adder comprising a first input end, a second input end and an output end;
a register comprising an input end and an output end; and
a shifter comprising an input end and an output end;
wherein the first input end receives the digital signal, the second input end is connected to the output end of the register, the output end of the adder is connected to the input end of the register, the output end of the register is connected to the input end of the shifter, and the output end of the shifter outputs the DC level.

15. The automatic gain control apparatus of claim 1, wherein the feedback circuit further comprises a short pulse detector for determining if the digital signal is a short pulse signal, if yes, the short pulse detector bypasses the digital signal, the amplitude level detector generates the first amplitude level and the second amplitude level in response to the digital signal after being bypassed.

* * * * *